United States Patent [19]

Midorikawa et al.

[11] Patent Number: 6,132,585
[45] Date of Patent: *Oct. 17, 2000

[54] SEMICONDUCTOR ELEMENT AND METHOD AND APPARATUS FOR FABRICATING THE SAME

[75] Inventors: Takafumi Midorikawa, Hikone; Tsutomu Murakami, Nagahama; Takahiro Mori, Nagahama; Hirofumi Ichinose, Nagahama, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/749,727

[22] Filed: Nov. 15, 1996

Related U.S. Application Data

[63] Continuation of application No. 08/415,585, Apr. 3, 1995, abandoned, which is a continuation of application No. 08/082,860, Jun. 28, 1993, abandoned.

[30] Foreign Application Priority Data

Jul. 1, 1992 [JP] Japan ................................. 4-197828

[51] Int. Cl.[7] ............................................. C25D 5/02
[52] U.S. Cl. ..................... 205/123; 205/124; 205/219; 438/584; 438/758; 438/778; 136/258; 136/290; 257/52; 257/53; 257/431; 257/458; 257/632; 257/647; 257/798
[58] Field of Search ................. 136/258 PC, 258 AM, 136/290; 437/2–5, 250, 923, 939; 205/123–124, 219; 257/52–53, 431, 458, 632, 647, 798; 148/DIG. 24, DIG. 50; 438/584, 758, 778

[56] References Cited

U.S. PATENT DOCUMENTS 4,197,141  4/1980  Bozler et al. .................... 136/258 PC
4,451,970  6/1984  Izu et al. ............................... 437/8
4,464,823  8/1984  Izu et al. .............................. 437/42
4,729,970  3/1988  Nath et al. ........................... 437/225
5,277,786  1/1994  Kawakami .......................... 205/124

FOREIGN PATENT DOCUMENTS 0268272  5/1988  European Pat. Off. .
0500071  8/1992  European Pat. Off. .
60-85577  5/1985  Japan ................................ 136/290

OTHER PUBLICATIONS

M. Matsumura et al. "Improvement and Amorphous silicon solar cells by electrochemical treatment", *J. of Applied Physics*, vol. 61, No. 4, Feb. 15, 1987 pp. 648–169.

Patent Abstracts of Japan, vol. 119, Apr. 14, 1987 and JPA–61–265–874, Nov. 25, 1986.

*Primary Examiner*—Nam Nguyen
*Assistant Examiner*—Steven H. Ver Steeg
*Attorney, Agent, or Firm*—Fitzpatrick, Cella, Harper & Scinto

[57] ABSTRACT

The present invention aims to provide a highly reliable semiconductor element with high performance, and a fabrication method for such highly reliable semiconductor with excellent mass producibility. The photovoltaic elements comprise an electric conductor, semiconductor regions and a transparent conductor layer, which are sequentially formed on a substrate. The shunt resistance in the semiconductor element is rendered in the range from $1 \times 10^3$ $\Omega cm^2$ to $1 \times 10^6$ $\Omega cm^2$ by performing a forming treatment and a short circuit passivation treatment after forming the transparent conductor layer, and then selectively covering with insulation the defective portions with a cationic or anionic electrodeposited resin, or performing a forming treatment, after forming the semiconductor layers, then selectively covering with insulation the defective portions with a cationic or anionic electrodeposited resin, and then forming the transparent conductor layer.

33 Claims, 8 Drawing Sheets

SEMICONDUCTOR ELEMENT AND METHOD AND APPARATUS FOR FABRICATING THE SAME

This application is a continuation of application Ser. No. 08/415,585 filed Apr. 3, 1995, now abandoned, which is a continuation of application Ser. No. 08/082,860 filed Jun. 28, 1993, now abandoned.

BACKGROUND OF THE INVENTION

1. Field of the Invention

The present invention relates to a reliable semiconductor element and a fabrication method therefor. And more particularly, the invention relates to a reliable semiconductor element having high initial characteristics wherein short circuit or shunt occurring in the fabrication process is compensated, and a method and apparatus for fabricating the same.

2. Related Background Art

Photoelectric conversion elements in the form of semiconductors for converting light into electrical energy have been utilized extensively as voltage sources for electronic instruments such as electronic calculators or wristwatches, and have become accepted as practicable as alternative electric power sources for so-called fossil fuels such as petroleum or coal.

Photovoltaic elements are based on utilizing the diffusion potential arising in the pn junction region of semiconductors, wherein charge carriers consisting of electrons and positive holes are produced when the semiconductor such as silicon absorbs light, with the charge carriers drifting due to the internal electric field caused by the diffusion potential at the pn junction, and withdrawn externally. The fabrication of photovoltaic elements is carried out by processes used with the fabrication of semiconductor elements Specifically, single crystal silicon is fabricated in p-type or n-type by a crystal growth method such as a CZ method, with the single crystal being sliced into silicon wafers having a thickness of 300 μm. The pn junction is then created by forming an opposite conductivity type layer by appropriate means such as that for diffusing a valence electron control agent to obtain an opposite conductivity type to that of the wafer.

When the fabrication method for photovoltaic elements uses the crystal-type semiconductor fabrication process as above described, the production costs are higher than those of the existing power generating methods.

For such reason, in order to put solar cells to practical use as a power source, lower cost is an important technical subject for which various studies have been made to obtain inexpensive materials or materials of high conversion efficiency. Such solar cell materials may include tetrahedral type semiconductors such as silicon, silicon-germanium, and silicon carbide, and Group II–VI compound semiconductors such as CdS and $Cu_2$ or Group III–V compound semiconductors such as GaAs and GaAlAs. In particular, thin film solar cells using amorphous type semiconductors have been expected to be useful because of their advantages that semiconductors of large area can be fabricated than for single crystals, the film thickness of the semiconductor can be thin, and arbitrary substrate materials can be used for deposition.

An amorphous silicon type photovoltaic element (hereinafter referred to as a solar cell) typically has a structure wherein a substrate is provided with a lower electrode, on which at least one semiconductor junction of thin film type consisting of a p-type semiconductor region, an i-type semiconductor region, and an n-type semiconductor region are laminated, and an upper electrode is provided thereon. Further, to increase the current collection efficiency, a grid electrode or a bus bar may be provided.

The amorphous silicon type photovoltaic element has lower conversion efficiency, because its film quality is degraded as compared with that of a crystal silicon photovoltaic element or a polycrystal silicon photovoltaic element, but to solve this problem, a so-called tandem cell or triple cell has been studied in which two or more semiconductor junctions are laminated in series.

When such solar cells are used, for example, to supply electric power to homes, an output of about 3 KW is generally required. When solar cells having conversion efficiency of 10% are used, the solar cell area must be as large as 30 $m^2$ or greater. However, with the usual solar cell fabricating processes, it is difficult to fabricate nondefective solar cells over such a large area. For example, with polycrystalline semiconductors, low resistive regions may arise at grain boundary portions, or in thin film solar cells of amorphous silicon type, pin holes or defects may occur due to the presence of dust during forming of the semiconductor film, causing a shunt or short circuit, which is known to significantly decrease the conversion efficiency. The cause of a pin hole or a defect and its influence will be described in more detail. For example, in amorphous silicon type solar cells having thin film layers deposited on a stainless substrate, the substrate surface is not a completely smooth surface, and may comprise flaws, dents, or spike-like projections, or is provided with an irregularly surfaced back reflector for the purpose of irregularly reflecting light, so that a thin film semiconductor having a thickness of about 10 nm such as in the p-type or n-type semiconductor region cannot cover the surface entirely, or pin holes may arise due to contaminants produced during forming of the films. Also, the semiconductor material between a lower electrode and an upper electrode of a solar cell may be lost at a pin hole, placing the lower electrode and the upper electrode in direct contact, or a spike-like defect of the substrate may make contact with the upper electrode. When there is a shunt or short circuit of low resistance, even if the semiconductor material is not completely absent, the electric current generated by light will flow parallel to the upper electrode into a low resistive portion of the shunt or short circuit, causing generated current to be lost. With such current loss, the open circuit voltage of the solar cell decreases.

In amorphous silicon type solar cells, because of the typically high sheet resistance of the semiconductor itself, a transparent upper electrode is used over the entire surface of the semiconductor, or a conductive antireflection film made of $SnO_2$ or $ITO(In_2O_3+SnO_2)$ is usually provided to suppress the surface reflection. Therefore, the electric current flowing into a defect is quite significant even if the defect is minute. Further, when the defect location is away from the grid electrode for current collection or the bus bar, the current loss is relatively small because of the great resistance when it flows into a defective portion, but conversely, when the defect is located under the grid electrode or bus bar, the electric current loss due to the defect is greater.

On the other hand, in the defective portion with the pin hole, electric charges generated by the photovoltaic element may not only leak into the defective portion, but also ionic substances are produced due to interaction with any water content, whereby by using the solar cell, the electric resistance at defective portions decreases gradually with time, and thus the conversion efficiency may be degraded.

When a short circuit occurs as above, the current loss can be reduced by removing or insulating the upper electrode at that region. A method of selectively removing the upper electrode in the shunt or short circuit portion has been disclosed in U.S. Pat. No. 4,729,970, which teaches a process wherein the solar cell is immersed in an electrolytic solution, and the short circuited portion is removed by etching while applying a bias to the solar cell. However, even if the upper electrode is removed by etching, a short circuit may occur again when the grid is provided in the shunt portion.

A solution for such problem is to raise the contact resistance with the transparent electrode, grid electrode, or bus bar by selectively covering only the defective portion with an insulator material or a material having high enough resistance to substantially prevent the shunt or short circuit, and this method serves as an effective means for preventing the decrease in conversion efficiency. A method of selectively covering with insulation only the defective portion includes detecting the defective portions of the solar cell with a detector, and thereafter applying an insulating material to the detected defective portions by using an applicator, as disclosed in U.S. Pat. No. 4,451,970. Or there is available a method as disclosed in U.S. Pat. No. 4,197,141 in which a polycrystal solar cell is immersed in an electrolytic solution to oxidize the crystal grain boundaries of the polycrystal or the defective portions caused by lattice mismatch by applying an electric field, depositing an insulating substance on the defective portions, or etching the defective portion.

The former invention, as disclosed, has a problem in that both the detector for defective portions and the applicator may constitute bulky apparatuses, which only allow detection in a greater range than the size of actual defects, and further the insulation may extend over unnecessary portions and be highly swollen, so that the grid contact cannot be printed thereon. Also, the latter invention, as disclosed, which is based on the concept of selectively depositing the insulating material, gives as an example anodizing of the defective portions of a gallium arsenide solar cell, but no disclosure of utility with silicon type solar cells is provided. Also, it includes depositing a metallic oxide such as aluminum, chromium, or copper, and no disclosure of the deposition of an organic polymer material is provided.

As above described, with the conventional method, the insulating material may deposit to a greater extent than necessary, so that the performance of the solar cell may be degraded. With either method, it is difficult to say that only the defective portions can be completely insulated with no other bad effects, whereby there is a problem that a remarkable reduction in performance cannot be avoided when it is applied to practical solar cells. Such a problem was also the case with TFT thin film semiconductors deposited in a large area.

An object of the present invention is to solve the aforementioned problems associated with semiconductor elements, and to provide a semiconductor element having excellent characteristics.

Another object of the present invention is to provide a fabrication method and apparatus for a semiconductor element which is more reliable and favorable for mass production.

SUMMARY OF THE INVENTION

To solve the aforementioned problems, a semiconductor element of the present invention is characterized in that the defective portion is selectively insulated with an electrodeposited resin, with a high shunt resistance.

That is, the present invention provides a semiconductor element characterized by having a cationic or anionic electrodeposited resin at the low resistive defective portions of a semiconductor subjected to dielectric breakdown.

The present invention provides a semiconductor element characterized in that the element is a photovoltaic element.

The present invention provides a semiconductor element characterized in that the element comprises a non-single crystal semiconductor.

The present invention provides a semiconductor element characterized in that the shunt resistance is from $1\times10^3$ $\Omega cm^2$ to $1\times10^6$ $\Omega cm^2$.

The present invention provides a semiconductor element characterized in that the dimension of the electrodeposited resin is ten times or less than that of the defective portion.

The present invention provides a semiconductor element characterized in that the electrodeposited resin is transparent.

The present invention provides a photovoltaic element having a semiconductor region for effecting photoelectric conversion and having a transparent electric conductor on the semiconductor region, characterized by having a cationic or anionic electrodeposited resin at the low resistive defective portions of the semiconductor region subjected to dielectric breakdown, and on the low resistive defective portions of the transparent electric conductor which have been electrochemically removed.

The present invention provides a photovoltaic element characterized in that the shunt resistance is from $1\times10^3$ $\Omega cm^2$ to $1\times10^6$ $\Omega cm^2$.

The present invention provides a photovoltaic element characterized in that the dimension of the electrodeposited resin is ten times or less than that of the defective portions.

Further, according to the present invention, there is provided a semiconductor compensating method characterized by a process of forming a dielectric breakdown region around the low resistive defective portions of a semiconductor region, and a process of selectively covering with insulation the dielectric breakdown regions with an anionic or cationic electrodeposited resin.

Further, according to the present invention, there is provided a semiconductor compensating apparatus comprising treatment means for yielding dielectric breakdown around the low resistive defective portions of a semiconductor region, and electrodepositing means for selectively covering with insulation the dielectric breakdown regions with an anionic or cationic electrodeposited resin.

Also, according to the present invention, there is provided a fabrication method for semiconductor elements, comprising a process of forming a semiconductor on a substrate and forming a transparent electric conductor on the semiconductor, a process of forming treatment to selectively subject defect regions to dielectric breakdown, a process of short circuit passivation treatment, and a process of selectively covering with insulation the defective portions with an anionic or cationic electrodeposited resin.

Also, according to the present invention, there is provided a fabrication apparatus for semiconductor elements, comprising means for forming a semiconductor on a substrate and for forming a transparent electric conductor on the semiconductor, means for forming treatment, means for short circuit passivation treatment, and means for selectively covering with insulation the defective portions with a cationic or anionic electrodeposited resin.

The present invention has been obtained from experiments performed by the present inventors for making a photovoltaic element wherein the low resistive defective portions caused by defects of the photovoltaic element are selectively insulated. Briefly summarized, a photovoltaic element is immersed in a suspension of charged organic polymer resin, and only the low resistive portions of the photovoltaic element are covered with the organic polymer resin by applying an appropriate voltage to the photovoltaic element, whereby the electric resistance of the low resistive portions becomes sufficiently high to prevent leakage of electric charges produced in the photovoltaic element into the defective portions, so that the characteristics such as the conversion efficiency of the photoelectric conversion element can be improved.

By insulatingly covering the defective portions with an organic polymer resin, the permeation or absorption of water into the defective portions is strongly suppressed, so that it is possible to greatly reduce degradation of the photovoltaic characteristics with the lapse of time, as will occur in practical use.

Further, in a solar cell element wherein a grid electrode is provided on a transparent conductive layer, there is no problem with excessive current leakage occurring due to direct electrical connection between the defective portions and the grid electrode, because the defective portions are covered with an electrically insulating resin.

As above described, the present invention includes a fabrication method and apparatus for photovoltaic elements in which a shunt or short circuit causing the photovoltaic characteristics to decrease can be remarkably improved by depositing an organic polymer resin to insulate the defective portions, and a photovoltaic element fabricated using the above fabrication method.

DETAILED DESCRIPTION OF THE PREFERRED EMBODIMENTS

The embodiments of a photovoltaic element according to the present invention will be described below with reference to the drawings.

Figure 1A:
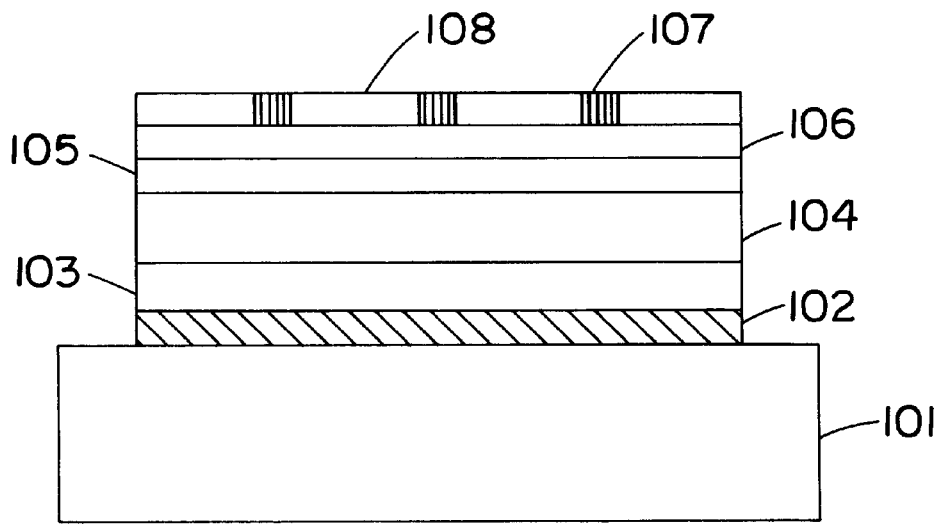
FIGS. 1A and 1B are schematic views showing the constitution of an embodiment of a solar cell according to the present invention.
Figure 1B:
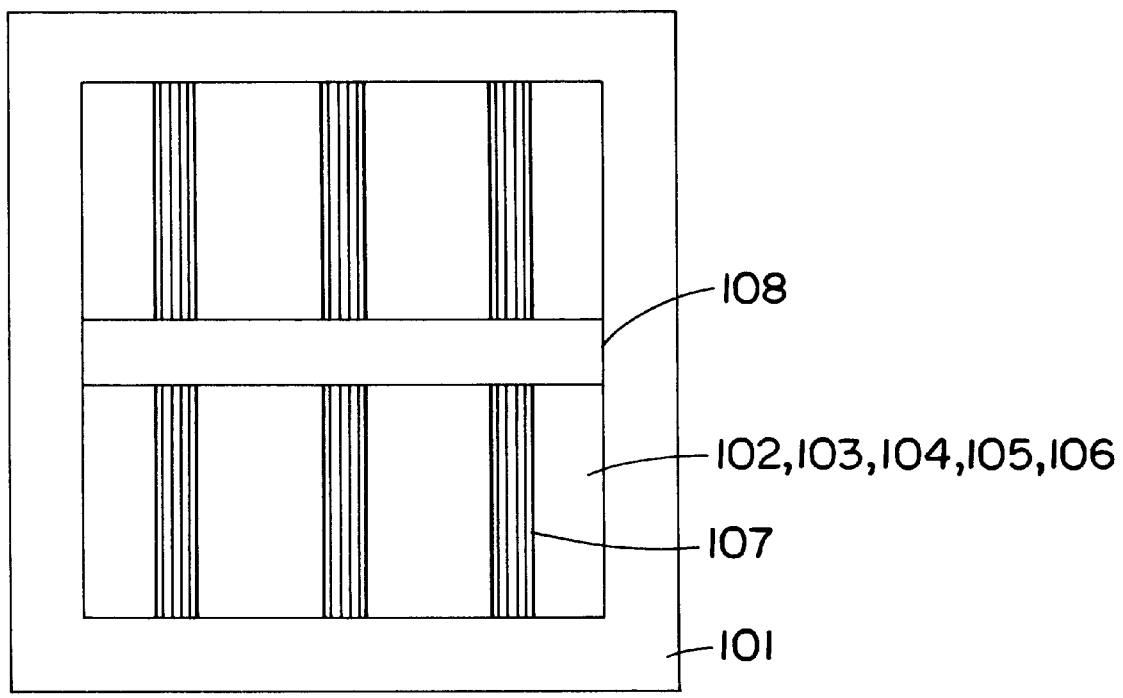
Figure 2:
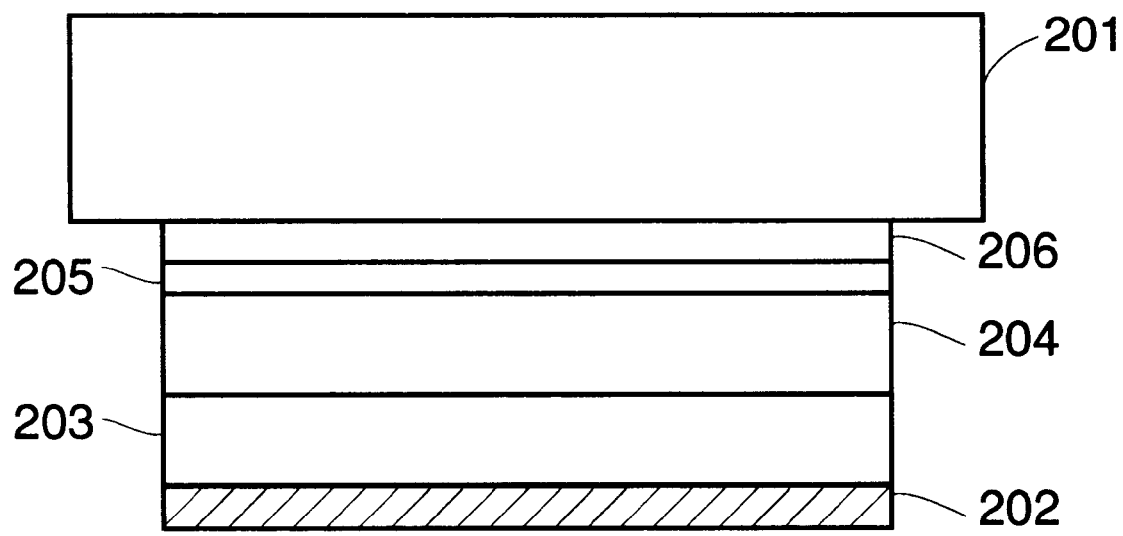
FIG. 2 is a schematic view showing the constitution of another embodiment of a solar cell according to the present invention.

A preferred embodiment of a photovoltaic element according to the present invention is shown schematically in FIGS. 1A, 1B, and 2. FIG. 1A is a cross-sectional view of an amorphous silicon type solar cell in which light is incident from the semiconductor region side opposite the substrate, and FIG. 1B is a plan view of the solar cell of FIG. 1A, as viewed from the light incident side. Also, FIG. 2 is a thin film solar cell made of amorphous silicon deposited on a translucent substrate such as glass, wherein incident light impinges the semiconductor region through an insulating substrate such as glass.

In FIGS. 1A, 1B, and 2, 101, 201 are substrates, 102 202 are lower electrodes (a conductive layer), 103, 203 are n-type semiconductor regions, 104, 204 are i-type semiconductor regions, 105, 205 are p-type semiconductor regions, 106, 206 are upper electrodes (transparent conductive layers), 107 is a grid electrode, and 108 is a bus bar.

The substrates 101, 201 are members for mechanically supporting the semiconductors 103, 104, 105, 203, 204, 205 in the thin film solar cell made of amorphous silicon. When the substrate is electrically conductive, it can be also used as the lower electrode. The substrates 101, 201 are required to have a heat resistance in order to withstand the heating temperature when forming the semiconductor film, but may be electrically conductive or insulating. Specific examples of electrically conductive materials include metals such as Fe, Ni, Cr, Al, Mo, Au, Nb, Ta, V, Ti, Pt, Pb, Ti, or their alloys, for example, a thin plate made of brass or stainless steel, and their composites, carbon sheet, and galvanized sheet iron. Examples of electrically insulating materials include films or sheets made of a heat-resisting synthetic resin such as polyester, polyethylene, polycarbonate, cellulose acetate, polypropylene, polyvinylchloride, polyvinylidene chloride, polystyrene, polyamide, polyimide, or epoxy, or their composites with glass fiber, carbon fiber, boron fiber, or metallic fiber, a thin plate of such a metal or resin sheet with the surface coated with a metallic thin film of a dissimilar material and/or an insulating thin film of $SiO_2$, $Si_3N_4$, $Al_2O_3$, AlN formed by sputtering, vapor deposition or galvanizing, glass, and ceramics.

The lower electrodes (conductive layers) 102, 202 are provided on the side opposite the light incident side of the semiconductors 103, 104, 105, 203, 204, 205 to output the generated electric power, and are required to have a work function such that an ohmic contact is formed with the semiconductors 103, 203. Examples of usable materials include simple metallic substances such as Al, Ag, Pt, Au, Ni, Ti, Mo, W, Fe, V, Cr, Cu, their alloys stainless, brass, nichrome, and transparent conductive oxides (TCO) such as $SnO_2$, $In_2O_3$, ZnO, ITO. The surface of the lower electrode is preferably smooth but may be irregular if irregular reflection of light is desired. In the constitution of FIGS. 1A and 1B, when the substrate 101 is electrically conductive, it is unnecessary to separately provide the lower electrode 102.

The semiconductor for use with the present invention may be a pin junction non-single crystal silicon, pn junction polysilicon and $CuInSe_2$/CdS. In amorphous silicon type solar cells, examples of the semiconductor material constituting the type semiconductor regions 104, 204 may include a-Si:H, a-Si:F, a-Si:H:F, a-SiGe:H, a-SiGe:F, a-SiGe:H:F, a-SiC:H, a-SiC:F, or a-SiC:H:F for so-called Group IV or Group IV alloy amorphous semiconductors.

The photovoltaic element of the present invention is applicable to a so-called tandem cell or triple cell wherein two or more semiconductor junction layers are laminated for the purpose of improving the spectral sensitivity or voltage.

Transparent conductive layers 106, 206 are upper electrodes for outputting the electromotive force generated by the semiconductor, and are paired with respective lower electrodes. Such an upper electrode is required for semiconductors having a high sheet resistance, such as amorphous silicon type semiconductors, but is not specifically required for crystal-type solar cells because of their low sheet resistance. Also, the upper electrode must be transparent because it is located on the light incident side, and thus is referred to as a transparent electrode.

The upper electrode desirably has a light transmittance of 85% or greater to allow sunlight or the light from a white fluorescent lamp to be absorbed efficiently into the semiconductor, and further desirably has an electrical sheet resistance of 100 $\Omega/\square$ or less to allow the current generated by light to flow across the semiconductor transversely. Materials having such characteristics include metallic oxides such as $SnO_2$, $In_2O_3$, ZnO, CdO, $CdSnO_4$, and ITO ($In_2O_3+SnO_2$).

Electrodeposited resin is used to insulate the short circuit or shunt portions generated by various defects such as pin holes, grain boundaries, and spike-like defects in the substrate 101 and the lower electrode 102 (or an upper electrode 206), and further has an additional feature of improving the moisture resistance. The shunt resistance of a solar cell is ideally infinite, but the conversion efficiency of the solar cell is not much affected by a shunt resistance of about $10^3$ to $10^6$ $\Omega cm^2$. However, if a shunt or short circuit is present due to defect, with a shunt resistance of 1 $K\Omega cm^2$ or less, the conversion efficiency will remarkably decrease.

The electrodeposited resin must be deposited directly on the defective portions. The electrodeposition process may be conducted immediately after the formation of semiconductor 105, 203 to adequately prevent the occurrence of defects in the semiconductor, or after the formation of the upper electrode 106 (or the lower electrode 202).

The resin backbone for electrodeposited resins having insulating and moisture-proof properties is appropriately selected from acrylic resin, polyester resin, epoxy resin, urethane resin, fluororesin, melamine resin, and butadiene resin. Also, to effect electrophoresis of such resin in an aqueous solution, it is necessary to introduce a functional group for ionizing the resin to produce ions in the aqueous solution. Examples of the functional group include a carboxyl group and an amino group. Electrodeposition paints with the above-cited resin dispersed therein can be classified into cationic type and anionic types in accordance with the polarity of the functional group. Based on the different polarity, they are appropriately selected in accordance with the desired characteristics.

Further, in order to permit curing of the electrodeposited resin by heating, a functional group capable of causing a cross-linking reaction, such as melamine crosslinking, carbon-carbon double bonds or urethane bonds, should be appropriately introduced into the resin backbone or side chain.

On the other hand, since the film of electrodeposited resin is preferably formed only on the defective portions of the solar cell, it is required that unnecessary paint be easily washed off after electrodeposition. Accordingly, the minimum film forming temperature (MFT) is 50° C. or greater.

To obtain a uniform film of electrodeposited resin, it is preferable that the resin is stably suspended in the solution without precipitation. For this purpose, the resin is desirably in the form of micelles of an appropriate size. The diameter of the micelles is desirably from about 10 to 100 nm in the monodispersed system. The molecular weight of resin backbone constituting the micelle is preferably about 1,000 to 20,000 in number average molecular weight. For the improvement of light resistance, heat resistance, moisture resistance, and selectivity of coating of defective portions, a filler such as inorganic pigment, ceramics, glass frit, and particulate polymer may be dispersed in the electrodeposited resin, and it is preferred that such filler is appropriately selected as desired. To insulate the defective portions of the solar cell selectively and effectively, a greater electrodeposition film weight per unit quantity of electricity is preferable, for which the Coulomb efficiency of the electrodeposition paint is preferably 10 mg/C or greater.

The solvent of the electrodeposition paint may be a solution containing an acid or alkali having a concentration at which the solar cell components such as the transparent electrical conductor, semiconductor region, and other conductors are not readily dissolved, or a solution containing a metallic salt thereof. Note that such metallic salt may be composed of a metal having a negative standard electrode potential, wherein the hydrogen overvoltage is smaller than the absolute value of the standard electrode potential. The electrodeposition paint is used by diluting it with deionized water, the preferable range for film formation containing 1% to 25% solid component. Also, the electrical conductivity of the liquid is desirably in a range of about 100 $\mu$S/cm to 2000 $\mu$S/cm, so that the resin can be stably suspended, easily bringing about electrophoresis, and readily allowing deposition on the desired defective portions.

In some fabrication methods of solar cells, the solvent is consumed or a thermal process is performed, after electrodeposition, in which it is preferred that the deposited electrodeposition film is not affected by such treatment. Also, the defective portions of the solar cell itself do not contribute to the power generation, but even when the electrodeposition film is selectively deposited, there is a possibility that the film may be deposited in a wider area than the area of a defective portion, for which it is preferable that the electrodeposition paint be of a light transmissive material so as not to prevent light from entering the semiconductor. Further, considering the various environments encountered when the solar cell is used outdoors, excellent weather resistance, and stability against heat, humidity, and light are required. Also, since the solar cell may be flexed or impacted during use in some cases, it is preferred that the solar cell has mechanical strength and peel resistance. The thickness of the electrodeposition film can be appropriately selected depending on the kind of resin, considering that the electrical insulating property and moisture resistance should be retained and the light transmissivity must not be impaired, but typically it is preferable to have a thickness from approximately 500 nm to 50 $\mu$m.

Grid electrode 107 is an electrode for outputting the electromotive force generated in the semiconductor regions 103, 104, 105, and is referred to as a collector electrode. The grid electrode 107 has a suitable arrangement determined from the sheet resistance of semiconductor 105 or upper electrode 106, but usually is formed in a comb-type shape, wherein it is preferable that the grid electrode is narrow with respect to the light incident plane and thick in the light incident direction so as not to prevent light incidence. The grid electrode preferably has a specific resistance of $10^{-2}$ $\Omega cm$ to $10^{-5}$ $\Omega cm$, which is not a series resistance of the solar cell. Examples of the material of the grid electrode include metallic materials such as Ti, Cr, Mo, W, Al, Ag, Ni, Cu, Sn, and conductive pastes composed of a metal powder such as Ag, Pt, Cu, C and an alloy thereof with polymer binder or binder solvent blended therein at an appropriate ratio to form a paste.

Bus bar 108 for use in the present invention is an electrode for further collecting and guiding the current flowing through the grid electrode 107 to one location. Examples of electrode material include metals such as Ag, Pt, Cu, and their alloys, or C, in which a wire- or foil-like electrode is adhered, or the same conductive paste as the grid electrode 107 may be used. Such foil may be, for example, a copper foil, a tin-plated copper foil, or a foil with adhesive.

The solar cell as fabricated above is formed as an encapsulated module by any of the well-known methods in order to have excellent weather resistance and mechanical strength in outdoor use. A specific example of an encapsulation material for use is EVA (ethylene-vinyl-acetate) in regard to adhesion, weather resistance, and cushioning property with the solar cell. Also, to improve moisture and damage resistance, a surface protective layer made of fluorine-type resin is laminated. Examples of fluorine-type resin may include, for example, a TFE polymer of tetrafluoroethylene (Teflon, manufactured by DuPont), a ETFE copolymer of tetrafluoroethylene and ethylene (Tefzel, manufactured by DuPont), polyvinyl fluoride (Tedlar, manufactured by DuPont), and CTFE polychlorofluoroethylene (Neofron, manufactured by Daikin Kogyo). Weather resistance can be improved by adding an ultraviolet absorbent to such resin. The methods of laminating such resin onto the solar cell substrate may include laminating it by heat in vacuum, using an apparatus available in the market such as a vacuum laminator.

The fabrication method of a photovoltaic element according to the present invention utilizes any one of the well-known methods for fabrication of a semiconductor film (an n-type semiconductor region, an i-type semiconductor region, a p-type semiconductor region), a lower electrode, an upper electrode, a grid electrode, and a bus bar.

The formation method for the semiconductor film may be selected as desired from methods such as vapor deposition, sputtering, RF plasma CVD, microwave plasma CVD, ECR, thermal CVD, and LPCVD. The semiconductor is formed, for example, by plasma CVD with a silane gas for non-single crystal silicon, by sheet formation of molten silicon for polycrystalline silicon, or by deposition such as electron beam deposition, sputtering, or electrolysis for $CuInSe_2$/CdS. Industrially, a plasma CVD method is preferably adopted in which a source gas is decomposed by plasma and deposited on the substrate. Also, a chemical reactor, a batch system or a continuous film-forming system can be used as desired. The fabrication of valence electron controlled semiconductors can be achieved by introducing and decomposing $PH_3$ or $B_2H_6$ gas containing constituent atoms such as phosphorus or boron, together with silane gas.

The semiconductor material constituting the p-type semiconductor region or n-type semiconductor region suitably used with the photovoltaic element of the invention can also be obtained by doping a valence control agent into a semiconductor material constituting the i-type semiconductor region. In obtaining a deposited film of a Group IV element in the periodic table, the valence electron control agent used for p-type semiconductors may be a compound containing an element of Group III in the periodic table. Examples of Group III elements include B, Al, Ga, and In. The valence electron control agent for n-type semiconductors may be a compound containing an element of Group V in the periodic table. Examples of Group V elements include P, N, As, and Sb.

The lower electrode is fabricated by plating, vapor deposition, or sputtering. The fabrication method of the upper electrode is appropriately selected as desired from resistance heating vapor deposition, electron beam heating vapor deposition, sputtering, and spraying.

The forming, short circuit passivation, and electrodeposition treatments of the present invention described below are performed in the process of fabricating the solar cell with the configuration of FIGS. 1A and 1B, as well as the solar cell having the configuration of FIG. 2.

The forming treatment is a process of greatly decreasing greatly the electrical resistance at the defective portions by applying a voltage between the conductive layer and the semiconductor region (or a transparent conductive layer) of a photoelectric conversion element having the conductive layer and the semiconductor region (or further transparent conductor) formed on the substrate in order to subject the defective portion (having a lower electrical resistance than its surroundings) to dielectric breakdown selectively and compulsorily. The applied voltage is in a range of approximately 2 to 10 V and is applied between the conductive layer and the semiconductor layer (or a transparent conductive layer), wherein it is necessary to select a voltage at which the normal portions of the photoelectric conversion element do not undergo dielectric breakdown. Also, the applied current used is reverse-bias direct current or current alternating between forward-bias and reverse-bias with a predetermined period with respect to the photoelectric conversion element.

Figure 6:
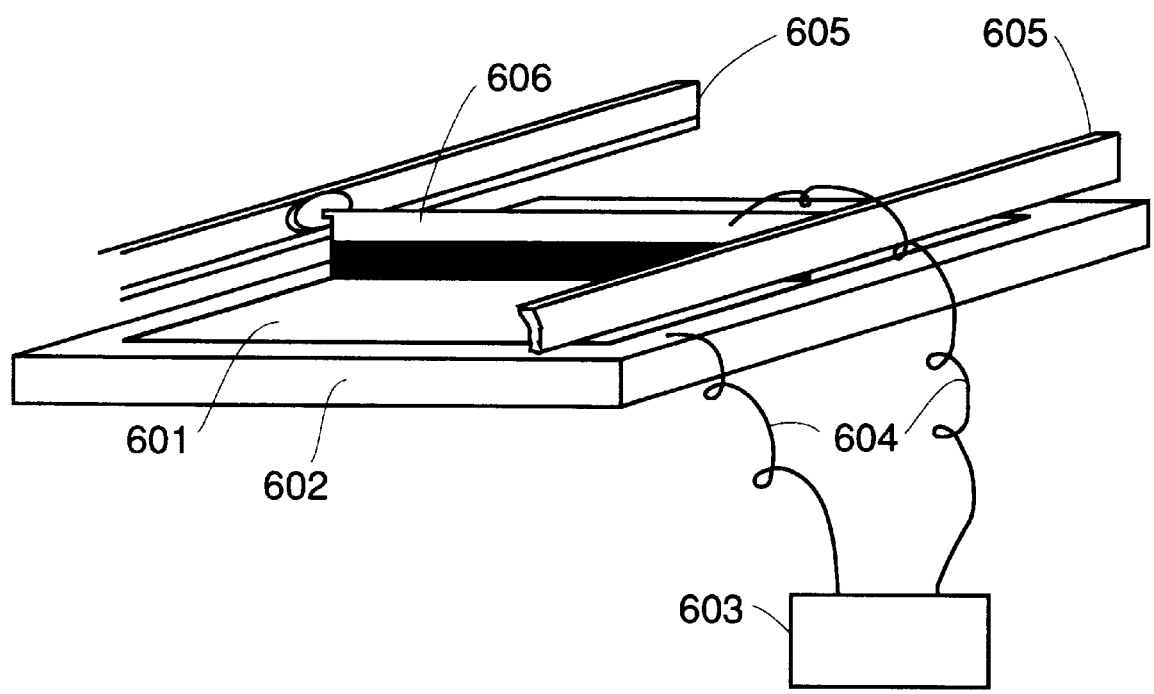
FIG. 6 is a schematic view showing an apparatus for forming treatment.

One example of a forming treatment apparatus is schematically illustrated in FIG. 6. 601 is a photoelectric conversion element to which forming treatment is applied, and is placed on an electrically conductive carrier board 602 with a substrate side facing down for electrical connection between the conductive layer and the carrier board. 603 is a power source, 604 are electrical leads, 605 is a driver portion for a voltage applier, and 606 is the voltage applier. The voltage applier serves to apply a uniform voltage to the entire surface of the semiconductor (or transparent conductive layer) surface of the photoelectric converter 601 while moving in parallel to the photoelectric converter 601. The voltage applier is preferably fabricated by using an electrically conductive soft brush or rubber roller which does not damage the surface of the photoelectric converter 601. The relative movement rate (forming treatment rate) between the voltage applier 606 and the photoelectric converter 601 should be as fast as possible from the viewpoint of productivity, and is preferably in a range from about 20 cm/min to 300 cm/min to assure reliable treatment.

While in FIG. 6 the voltage applier 606 is moved, the photoelectric conversion element 601 can be moved, with the voltage applier 606 being fixed, to achieve the same forming effect. The latter is preferred, particularly when the photovoltaic element is moved by a roll to roll method.

Figure 7:
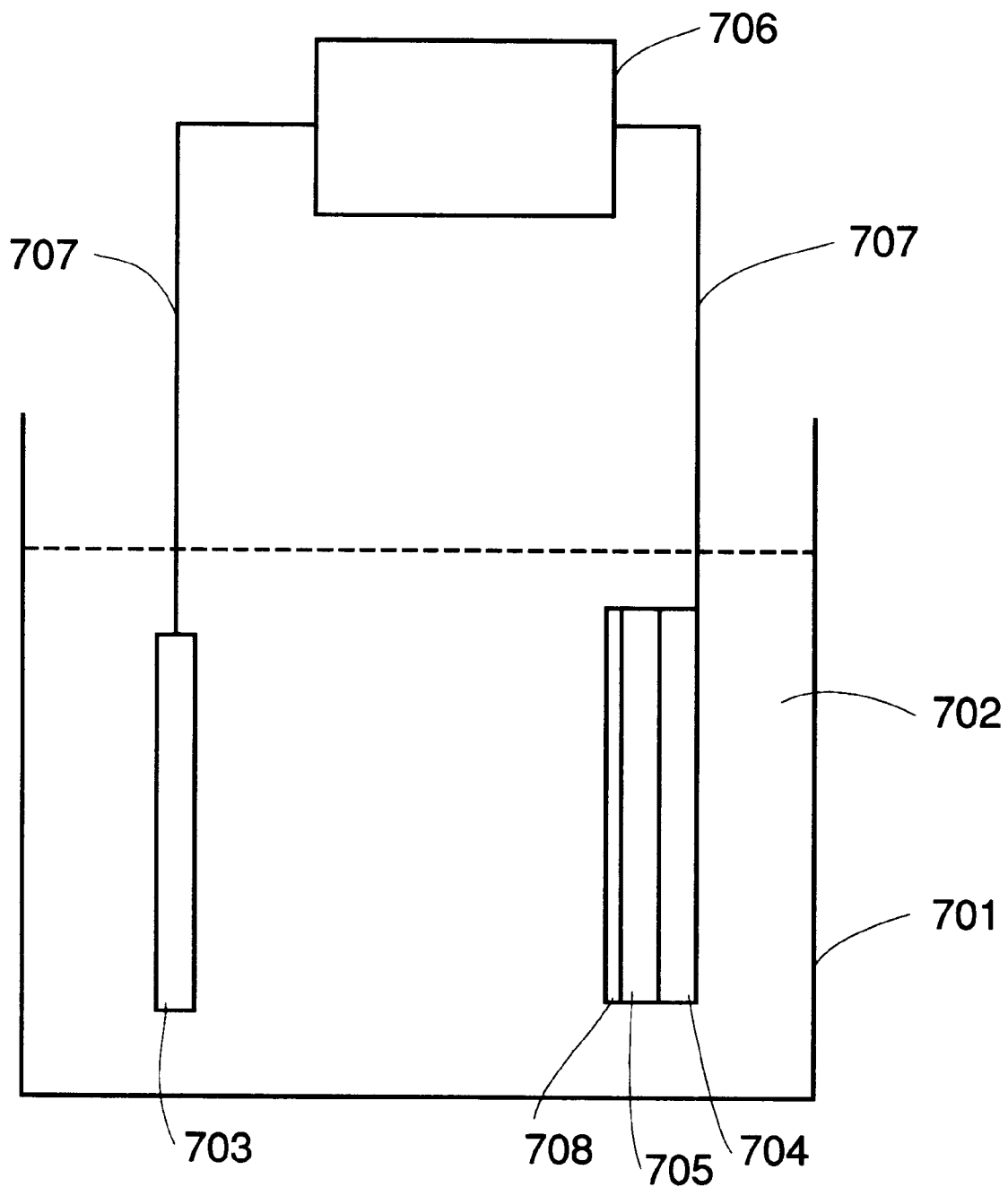
FIG. 7 is a schematic view showing an apparatus for short circuit passivation treatment.

The short circuit passivation treatment is to selectively electrochemically remove the defective portions of a photoelectric converter having a conductive layer, semiconductor regions, and a transparent conductive layer formed in sequence on the substrate, thereby dissolving and removing partially or entirely the material at the defective portions. An example of an electrolytic apparatus to be used is schematically illustrated in FIG. 7. An electrolytic tank 701 is filled with an electrolyte 702. An anode 703 electrically connected to a conductive member 707 and a photoelectric converter as a cathode are immersed in the bath. The conductive member 707 is connected to a DC power source 706. The conductive member 707 on the cathode side is electrically connected to the conductive substrate layer 704 of the photovoltaic element. In FIG. 7, a semiconductor layer 705 and a transparent conductive layer 708 are formed in sequence on the substrate 704. The electrolyte 702 may be an acid solution such as hydrochloric acid, nitric acid or sulfuric acid, an alkaline solution such as sodium hydroxide or potassium hydroxide, or a metallic salt solution, having a concentration at which the transparent conductive layer is not easily dissolved. Such metallic salt may be a salt composed of a metal having a negative standard electrode potential, in which the hydrogen overvoltage is smaller than the absolute value of the standard electrode potential. Specifically, examples thereof include aluminum chloride, magnesium sulfate and sodium chloride. For more efficient electrolysis, the electrical resistance of the electrolyte 702 needs to be sufficiently low, and is preferably set in a range from about 0.05 to 1.0 S/cm.

The materials for the anode 703, which is a counter electrode, may include platinum, titanium and graphite. The voltage to be applied to the cathode must be 2V or greater, considering the hydrogen overvoltage. Also, the electrolytic current density is preferably from 0.1 to 50 mA/cm$^2$ to prevent side reactions.

While in FIG. 7, the anode 703 and the cathode which is a photoelectric converter are immersed in the electrolyte, the anode and the cathode are only necessary to be placed via the interposition of the electrolyte, and specifically an anode vessel may be provided which is electrically connected to the power source 706 and contains an electrolyte therein, and the photoelectric converter is moved in contact with the surface of the electrolyte to dissolve the defective portions.

Figure 5:
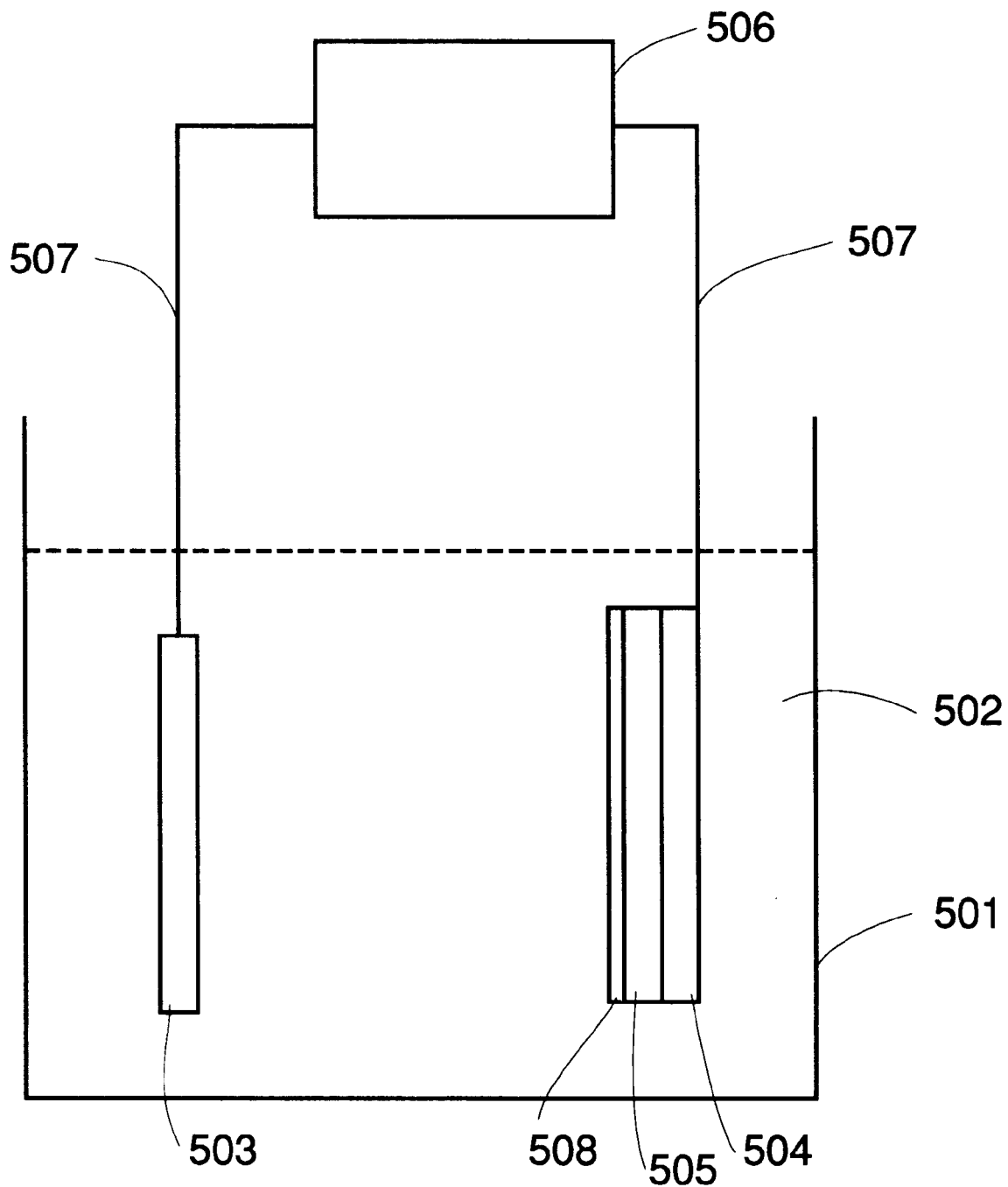
FIG. 5 is a schematic constitution of an electrodeposition apparatus.

The process of selectively depositing the electrodeposited resin on the defective portions is performed by immersing a photovoltaic element having the defective portions and a counter electrode in the electrodeposition paint, and applying a voltage between the photovoltaic element and the counter electrode to deposit an electrodeposition film on the defective portions. A schematic electrodeposition vessel is illustrated in FIG. 5. FIG. 5 shows an example of an apparatus for conducting electrodeposition treatment of a photoelectric converter having an upper electrode formed thereon. 501 is an electrolyte tank, 502 is a liquid electrodeposition paint, 503 is a counter electrode, 504 is an electrically conductive substrate (substrate provided with a lower electrode thereon), 505 is a semiconductor region, 506 is a power source, 507 is an electrically conductive member connecting respective electrodes to the power source 506, and 508 is a transparent conductive layer which is an upper electrode.

The lead wire from the photovoltaic element may be drawn out from the conductive substrate or the lower electrode, as shown in FIG. 5. The material of the counter electrode 503 is required not to be corroded in the electrodeposition paint, and preferable examples thereof include platinum, nickel, and stainless which are corrosion resistant. Also, it is necessary for even electrodeposition that the area of the counter electrode 503 is at a fixed ratio relative to the area of the photovoltaic element, and it is preferable that the ratio of the photovoltaic element area to the counter electrode area, or so-called electrode ratio, is in a range from 1/2 to 2/1. The anode-cathode distance between the photovoltaic element and the counter electrode 503 is an important factor for obtaining evenness of electrodeposition, the preferable range in view of various conditions such as electrical conductivity of the electrodeposition paint 502 or the applied voltage being typically from 10 mm to 100 mm.

To selectively deposit the electrodeposition film on the defective portions of the photovoltaic element, the substrate and other conductive portions preferably should not be exposed to the electrodeposition paint 502 when the substrate 504 is electrically conductive. Therefore, it is desirable that the back surface of the conductive substrate 504 which is opposite the light incident side is covered with an insulating material such as a plastic film or a rubber magnet, whereby only the electrodeposition paint and the photoelectric converter are brought into contact. Also, if the photovoltaic element is illuminated by light, the normal portions (rather than the defective portions) have their resistance reduced by the photoelectromotive force resulting in a lower ratio of the resistance of the defective portions to that of the normal portions, and thus a lower selectivity. Accordingly, it is possible to provide a desired selectivity by conducting the electrodeposition in the dark if necessary.

The electrodeposition can be made either through a constant voltage or constant current anodic process, but in the constant voltage anodic process, for example, the voltage to be applied to the photovoltaic element should be a voltage at or above a hydrogen-generating voltage which is calculated from the electrode voltage defined by Nernst's equation, and more specifically, a voltage which is the sum of the theoretical decomposition voltage of water plus an overvoltage, or 2 volts or greater. Further, the preferable voltage range may be different, depending on the electrical conductivity of the electrodeposition paint or whether the polarity of the voltage applied to the photovoltaic element is reverse-biased or forward-biased, and thus can be selected substantially in a range from about 2V to 200V, in view of various respects such as the constitution and area of the solar cell, the material properties such as electrical conductivity of the electrodeposition paint, polarity of the applied voltage, and quantity of light (the dielectric breakdown voltage will vary in reverse-bias).

Also, because a part of the applied voltage is applied to the solar cell, the voltage must be within a range in which the photovoltaic element does not undergo dielectric breakdown, when reverse-biased. Conversely, when forward-biased, the photovoltaic element has a forward current flowing therethrough, with the selectivity degraded, so that the electrodeposition film may likely be deposited on portions other than the defective portions. From this aspect, a voltage not impairing the selectivity must be chosen.

In the constant current electrodeposition current method, the current density is preferably in a range from 0.1 to 10 A/cm$^2$, depending on the degree of shunting of the photovoltaic element, to form a dense electrodeposition film.

In either of the anodic constant voltage and constant current methods, the way of determining the termination of electrodeposition relies on the elapsed time or the Coulomb quantity. Since the electrodeposition paint film having a high resistance will not be formed in the defective portions above a certain film thickness, it is possible that electrodeposition is automatically terminated on the defective portions, depending on the constitution of the photovoltaic element, thereby not allowing current to flow. However, when a forward bias is applied to the photovoltaic element, the deposition will over time extend over the normal portions, even though some selectivity may exist at the early stage of electrodeposition, whereby it is preferable to control the termination of electrodeposition according to the elapsed time or the Coulomb quantity, as previously described.

Figure 8:
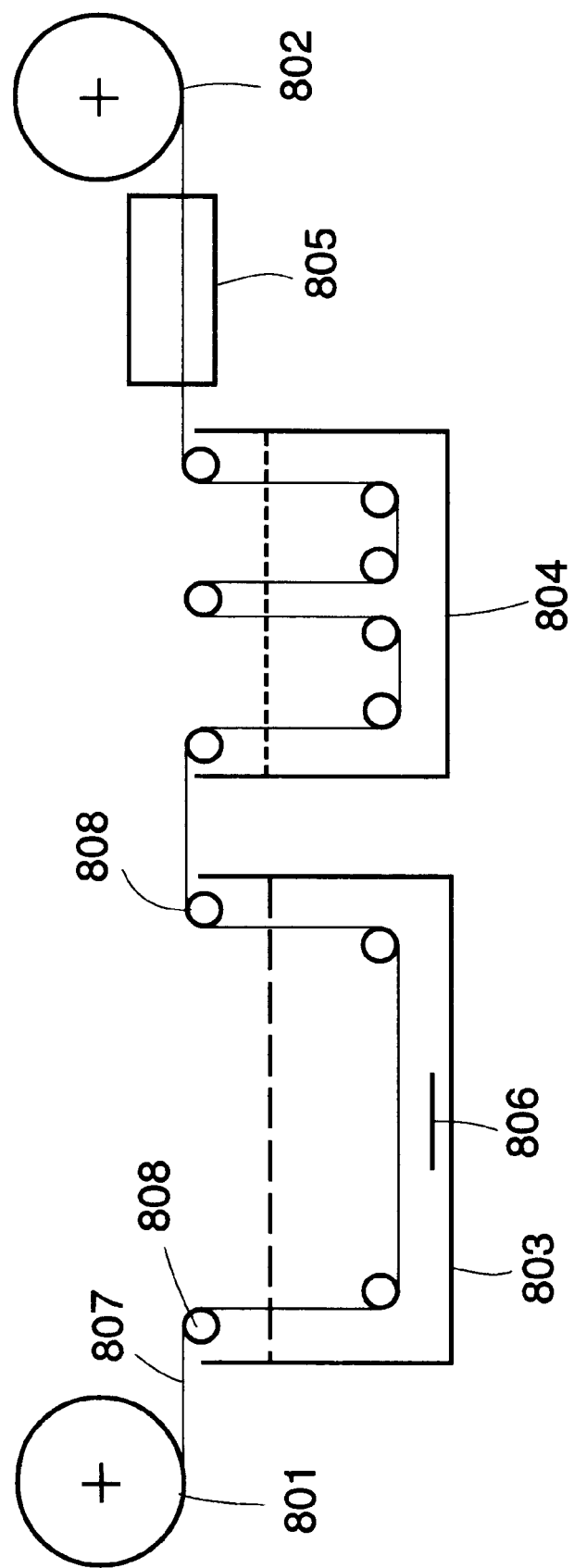
FIG. 8 is a schematic constitutional view of an apparatus suitable for electrodeposition by a roll-to-roll method.

In the above description, the photovoltaic element is sheet-like, and the electrodeposition process is a batch process, but it can be performed on a roll-to-roll basis which allows for continuous processing, as necessary. An apparatus suitable for roll-to-roll processing is shown in FIG. 8. In a preferred embodiment as shown in this figure, a photovoltaic element 807 comprises a nip-type amorphous silicon layer deposited on a stainless substrate, on which an upper electrode of ITO is formed. The photovoltaic element 807 is delivered from a supply roll 801 and immersed in an electrodeposition vessel 803, wherein a voltage is applied with respect to a counter electrode 806. It is then passed through a cleaning vessel 804 and a drying furnace 805 and then wound around a take-up roll 802. Before immersion in the electrodeposition vessel 803, a masking film for the back surface of the photovoltaic element is delivered from a plastic film roll not shown and bonded with the back surface of the photovoltaic element. After completion of the electrodeposition, it is peeled off again and wound up after cleaning and drying. The electrodeposition voltage is applied between conductive rollers 808 in contact with the substrate of the photovoltaic element and the counter electrode 806 installed within the electrodeposition vessel.

The above-described series of processings will now be described with reference to FIGS. 3A to 4D.

Figure 3A:
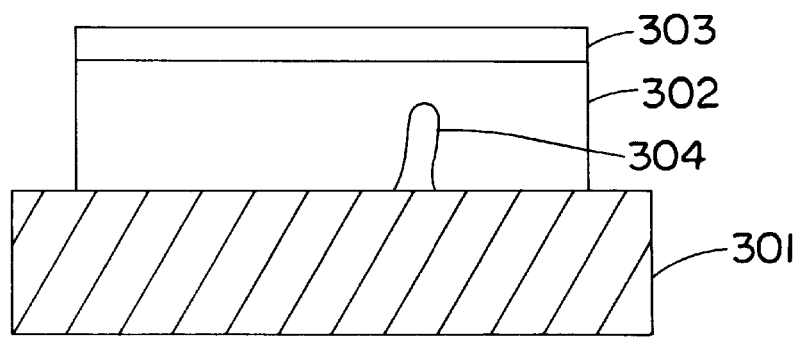
FIGS. 3A, 3B, 3C, and 3D are schematic views showing each process of defect sealing according to the present invention.
Figure 3B:
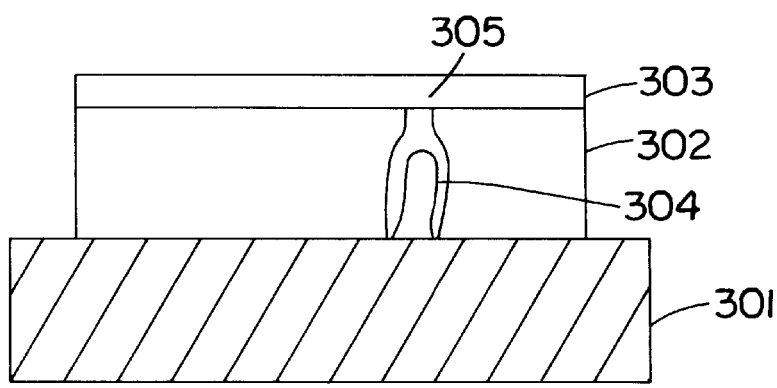
Figure 3C:
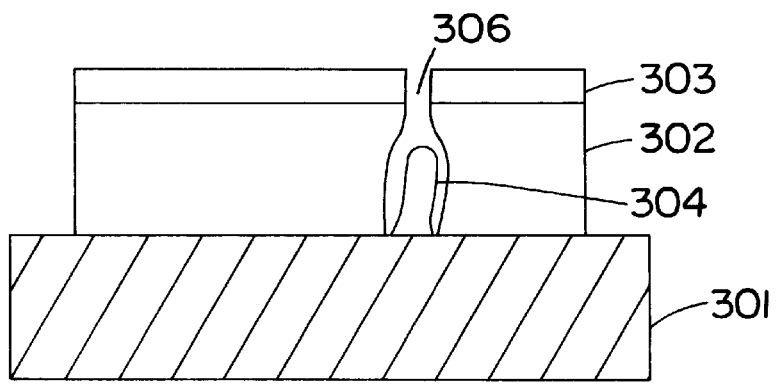
Figure 3D:
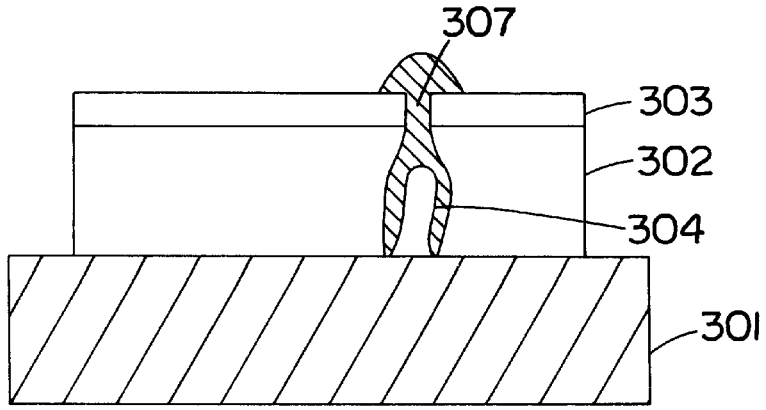

In FIG. 3A, 301 is a conductive substrate, 302 is a semiconductor region, 303 is a transparent conductive layer, and 304 is a defective portion. FIG. 3B illustrates the state after the forming treatment, in which 305 is a portion with reduced electrical resistance formed near the defective portion by the forming treatment. FIG. 3C illustrates the state after the short circuit passivation process, in which 306 is a portion with lower electrical resistance which has been dissolved and removed by the short circuit passivation. FIG. 3D illustrates the state after the electrodeposition processing, in which 307 is a defective portion formed by the short circuit passivation which has been sealed by an electrodeposited resin.

Figure 4A:
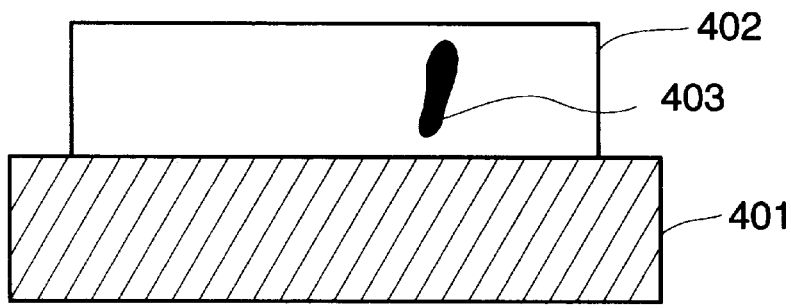
FIGS. 4A, 4B, 4C, and 4D are schematic views showing each process of defect sealing according to another embodiment of the present invention.
Figure 4B:
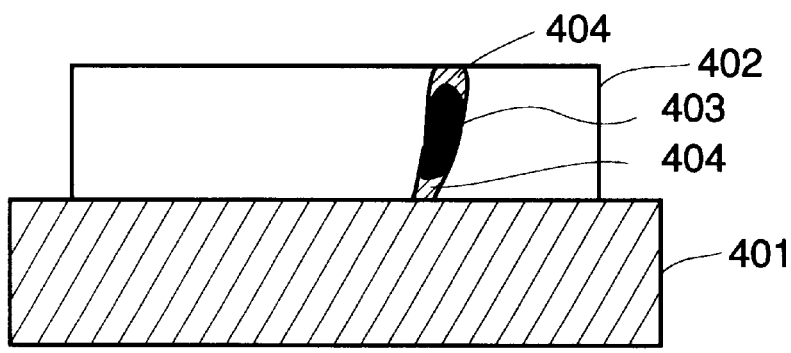
Figure 4C:
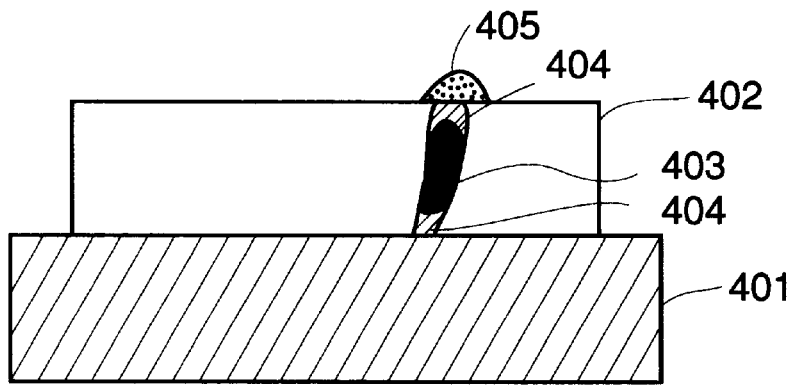
Figure 4D:
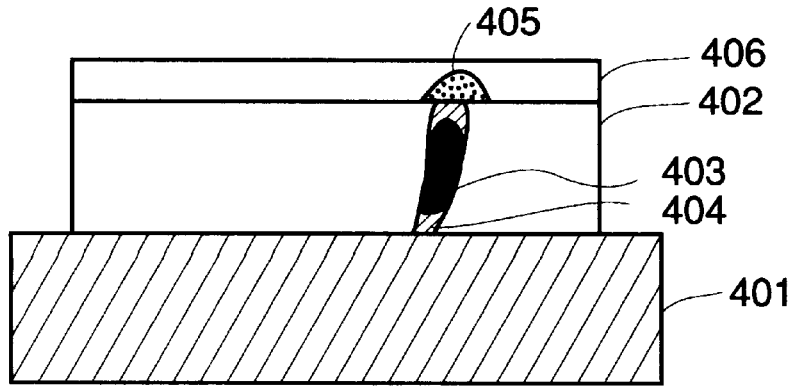

In FIG. 4A, 401 is a conductive substrate, 402 is a semiconductor region, and 403 is a defective portion. FIG. 4B illustrates the state after the forming process, in which 404 is a portion with reduced electrical resistance near the defective portion produced by the forming treatment. FIG. 4C illustrates the state after the resin electrodeposition process, in which 405 is an electrodeposited portion. FIG. 4D illustrates the state after ITO deposition, in which 406 is an ITO layer deposited on the resin 405 with the semiconductor layer 402 and the defective portion 403 sealed.

While in FIGS. 3A–3D and FIGS. 4A–4D the semiconductor region and the transparent conductive layer are formed on a conductive substrate, the transparent conductive layer, the semiconductor regions, and the conductive layer can be formed on a transparent substrate, as previously described.

The methods of forming the comb-shaped grid electrode 107 include vapor deposition such as sputtering, resistance heating or CVD, patterning by etching after vapor deposition of a metallic layer over the entire face, directly forming a grid electrode pattern with photo-assisted CVD, plating after forming the mask of the grid electrode pattern, and printing of conductive paste.

Electrodes made of conductive paste can be fabricated with good productivity by using the screen printing method. The screen printing method is a method in which the electrically conductive paste is used as the printing ink with a screen having a desired pattern applied on a nylon or stainless mesh, the width of the electrode being about 50 $\mu$m at minimum. The printing machine is preferably a screen printing machine. The conductive paste subjected to screen printing is heated in a drying furnace for the crosslinking of the binder and volatilization of the solvent.

In the following, the constitution and fabrication method of a solar cell of the present invention will be described in more detail by way of examples, but the present invention is not limited to such examples.

EXAMPLE 1-1

A solar cell having a layer constitution as shown in FIG. 1A was fabricated. First, a SUS430BA substrate 101 (30 cm×30 cm, 0.2 mm thick), which had been subjected to degreasing and washing, was placed within a DC sputtering apparatus (not shown) in which a lower electrode 102 was formed by depositing Cr 200 nm thick. The substrate 101 was taken out and placed within an RF plasma CVD film forming apparatus (not shown) for the deposition of an n-type semiconductor region 103, an i-type semiconductor region 104, and a p-type semiconductor region 105 in this sequence. Thereafter, an alloy of In and Sn was vapor-deposited by resistance heating in a vapor deposition apparatus (not shown) to deposit a 70 nm thick transparent upper electrode 106 having an antireflection effect, whereby a solar cell was fabricated.

Next, the solar cell was treated in the forming treatment apparatus of FIG. 6. The applied voltage was 3V of reverse biased direct current, with the processing rate being 180 cm/min. The solar cell was then subjected to short circuit passivation treatment in the short circuit passivation apparatus of FIG. 7. 10% $AlCl_3$ aqueous solution filled the electrolytic tank 701, and the back side of the solar cell was covered with an insulating film made of plastic and immersed in the electrolytic tank 701 of FIG. 7. A voltage of −4V was applied to the conductive substrate of the solar cell, and held for three seconds. In this process, ITO of the shunt portions and parts of the defective portions were removed. After washing, drying was conducted.

Subsequently, the substrate of the solar cell which had undergone various treatments as previously mentioned was covered on the back surface side thereof with an insulating film of plastic, and immersed in the electrolytic tank 501 of FIG. 5 so that the back surface of the substrate 504 was not subjected to electrodeposition. The counter electrode 503 used was 30 cm×30 cm SUS304 stainless plate, with the back surface of the substrate 504 sealed using an insulating film made of plastic. The electrodeposition paint 502 used was an acrylic-type cationic electrodeposition paint containing 20% solids. A −10V voltage was applied to the substrate 504, and held for ten seconds to conduct electrodeposition. The solar cell was removed from the electrolytic tank, washed with pure water to remove unreacted electrodeposition paint, placed in an oven at 50° C., and left for thirteen minutes to remove the water content. Thereafter, the temperature of the oven was elevated at a rate of 10° C./min, and held for thirty minutes after reaching 180° C., to cure the electrodeposited resin.

Thereafter, the solar cell was taken out of the oven, and after cooling, a part of the solar cell was cut out. Observation of the surface of the ITO layer 508 by a scanning-type electron microscope showed that semi-spherical deposits, about 5 $\mu$m to 30 $\mu$m in diameter, were spotted on the surface of the ITO layer 508. Infrared absorption spectrum analysis using an FTIR with a microscopic feature on that portion confirmed that there was absorption peculiar to the acrylic resin, and electrodeposition paint was deposited. Further, observation of the ODIC (an optical excitation current microscope) image using a 2LM21 scanning-type laser microscope manufactured by Laser Tec confirmed that only the portions covered by electrodeposition paint generated no power, indicating that the film was deposited only on the shunt portions.

Next, the solar cell was placed in a screen printing machine (not shown) in which grid electrodes 107, 100 $\mu$m wide and 8 cm long, were printed at an interval of 1 cm. The conductive paste contained 70 parts of Ag filler, 30 parts of polyester binder (volume ratio), and 20 parts of ethyl acetate as a solvent. After printing, the solar cell was placed in an oven, and held at 150° C. for thirty minutes to cure the conductive paste.

Further, a bus bar 108 of copper foil with an adhesive 5 mm wide (as shown in FIG. 1B) was bonded to fabricate a single cell of 30 cm square. With the same method, ten samples were fabricated.

Next, the encapsulation of these samples was conducted in the following way. EVA was laminated both on the front and back surfaces, and a fluororesin film ETFE (ethylene tetrafluoroethylene, trademark Tefzel, manufactured by DuPont) was further laminated on the outer surfaces thereof. Subsequently, the samples were placed in a vacuum laminator and held at 150° C. for sixty minutes for conducting the vacuum lamination, so that a solar cell module was fabricated.

The initial characteristics of the solar cell module obtained were measured as follows.

First, measurement of the voltage/current characteristics of the samples in the dark state indicated that the shunt resistance as obtained from the slope near the origin had excellent values such as 500 K$\Omega$cm$^2$ to 300 K$\Omega$cm$_2$, with less dispersion. Next, using an artificial sunlight source (hereinafter referred to as a simulator) having a sunlight spectrum of AM 1.5 global and a light intensity of 100 mW/cm$^2$, the measurement of the solar cell characteristics showed that the conversion efficiency was 6.8%±0.5%, indicating excellent characteristics and less dispersion.

Reliability testing of these samples was conducted based on a temperature and humidity cycle test A-2 defined in the environmental test method and the durability test method for crystal-type solar cell modules according to Japanese Industrial Standards C8917.

First, the samples were placed in a thermo-hygrostat capable of controlling temperature and humidity, and a cyclic test of changing the temperature from −40° C. to +85° C. (relative humidity of 85%) was repeated 10 times. Then, after completion of the test, the solar cell characteristics were measured in the same way as at the initial time, using a simulator, and the average conversion efficiency was found to be 95% of the initial conversion efficiency, with no significant degradation. Also, the shunt resistance was measured, and it had decreased about 10%, with no significant degradation. From these results, it was determined that the series of processings of the present invention produced excellent effects.

From the results of this example, it was concluded that the solar cells fabricated with the method of the invention had good yield, excellent characteristics, and high reliability.

EXAMPLE 1-2

The sealing of defects of the solar cell was conducted in the same way as Example 1-1, except that in the electrodeposition, an acrylic-type anionic electrodeposition paint containing 10% solid components was used, and a voltage of +10 V was applied to the substrate.

Thereafter, a part of the solar cell was cut out. The observation of the surface of the ITO layer by a scanning-type electron microscope showed that semispherical deposits, about 5 $\mu$m to 30 $\mu$m in diameter, were spotted on the surface of the ITO layer 508. The infrared absorption spectrum analysis using an FTIR with a microscopic feature on that portion confirmed that there was absorption peculiar to acrylic resin, and electrodeposition paint was observed. Further, observation of the OBIC image confirmed that only the deposited portions generated no power; thus the film was deposited only on the shunt portions.

Next, by forming the grid electrode and the bus bar and conducting encapsulation, a solar cell module was fabricated. The measurement of the shunt resistance of the obtained solar cell module showed 500 K$\Omega$cm$^2$ to 300 K$\Omega$cm$^2$, with excellent characteristics and less dispersion. Also, the conversion efficiency was 6.1%±0.5%, with excellent characteristics and less dispersion.

The solar cell efficiency after completion of testing was on average 95% of the initial conversion efficiency, with no significant degradation. Also, the shunt resistance decreased about 10%, with no significant degradation. From these results, it was concluded that the series of processings of the present invention had excellent effects.

From the results of this example, it was concluded that the solar cells fabricated by the method of the invention had good yield, excellent characteristics, and high reliability.

Comparative Example 1

For the comparison, a solar cell with the same constitution as in Example 1 was fabricated in the following way, without forming treatment, short circuit passivation, and electrodeposition.

In the same way as in Example 1, the portions of the solar cell up to the upper electrode 106 were fabricated on a substrate 101. Next, grid electrodes 107 were printed in the same way. Further, a copper foil with adhesive was laminated thereon as the bus bar 108, so that a single cell of 30 cm square was fabricated.

Next, encapsulation of this sample was conducted in the same way as in Example 1. The initial characteristics were measured in the same procedure as in Example 1. The conversion efficiency was 4.1%, and the shunt resistance was 3.8 K$\Omega$cm$^2$, it being observed that the shunt resistance was lower than in Example 1 and thus the conversion efficiency was lower.

The reliability test of this sample was conducted in the same way as in Example 1. After the completion of the temperature and humidity cycle test, the solar cell characteristics were measured. The conversion efficiency was 86% of the initial value, with significant degradation indicated. Also, the measurement of shunt resistance indicated a decrease of about 20%, it being found that the shunt occurred after the completion of the reliability test.

The presence of shunt portions in this sample was confirmed as follows. First, a reverse bias of 1.5 V was applied to the sample. The shunt portions had a current flowing therethrough and were heated, but the normal portions, reverse-biased, had no current flowing therethrough, and thus were not heated. In this state, the observation of the surface of the sample by an infrared detection camera showed the heat-generating portion, revealing that there was a shunt under the grid electrode 107.

EXAMPLE 2-1

Next, a solar cell with the constitution of FIG. 2 was fabricated substantially in the same way as in Example 1.

First, a transparent upper electrode 206 of SnO$_2$ was deposited on a glass substrate (Corning 7059) of 30 cm square, using a vapor deposition apparatus (not shown). Thereafter, the upper electrode 206 was patterned by etching so that spaced apart sub-cells 2 cm wide were arranged with a gap of 5 mm. Next, using a metal mask, p-type semiconductor region 205, i-type semiconductor region 204, and n-type semiconductor region 203 were deposited to substantially cover the upper electrode 206. Further, the substrate 201 deposited up to the n-type semiconductor region 203 was placed within a sputtering apparatus (not shown) using a metal mask, to fabricate a lower electrode of aluminum, so that ten single cells of 30 cm were fabricated.

Next, in the same way as in Example 1, the forming and short circuit passivation treatments were conducted. Subsequently, the substrate 201 thus treated was immersed in an electrolytic tank 501 using an epoxy-type cationic electrodeposition paint.

With the above fabrication method, 10 sheets of samples were fabricated. The initial characteristics were such that the conversion efficiency was 6.4%±1%, and the shunt resistance was from 350 to 200 K$\Omega$cm$^2$.

Next, the reliability test of these samples was conducted in the same way as in Example 1. After the temperature and humidity cycle test, the measurement of the solar cell characteristics indicated 97% of the initial value, with no degradation. Also, the measurement of the shunt resistance indicated almost no change.

From the results of this example, it was concluded that the solar cells fabricated with the method of the invention had good yield, excellent characteristics, and high reliability.

EXAMPLE 2-2

A solar cell module was fabricated in the same way as in Example 2-1, except that the electrodeposition was performed using an epoxy-type anionic electrodeposition paint.

The initial characteristics of the obtained solar cell module were conversion efficiency of 6.0%±1% and shunt resistance of from 350 to 200 K$\Omega$cm$^2$. After the temperature and humidity cycle test, the measurement of the solar cell characteristics indicated 97% of the initial values, with no degradation. Also, the measurement of the shunt resistance indicated almost no change.

From the results of this example, it was concluded that the solar cells fabricated with the method of the invention had good yield, excellent characteristics, and high reliability.

EXAMPLE 3-1

A solar cell having a constitution as shown in FIGS. 1A and 1B was fabricated substantially in the same way as in Example 1.

As in Example 1, a lower electrode 102 was formed on a SUS430BA substrate 101 (30 cm×30 cm, 0.2 mm thick). The substrate 101 was placed within an RF plasma CVD film-forming apparatus (not shown) for the deposition of n-type semiconductor region 103, i-type semiconductor region 104, and p-type semiconductor region 105 in this sequence. Thereafter, a 70 nm thick transparent upper electrode 106 having an antireflection effect was deposited thereon.

Next, after performing the forming and short circuit passivation treatments in the same way as in Example 1, the back side of the substrate 101 was covered with an insulating film made of plastic in the same way as in Example 1, and it was then immersed in the electrolytic tank of FIG. 5. A styrene-type cationic electrodeposition paint was used therein. The coated substrate was washed with pure water and the electrodeposited resin was then cured within an oven. Thereafter, the substrate 101 was taken out of the oven, and after cooling, a bus bar 108 of copper foil with adhesive was laminated thereon to fabricate a single cell of 30 cm square. With the same method, ten sheets of sample were fabricated.

Further, the encapsulation of these samples was conducted in the same way as in Example 1. The initial characteristic of the samples was 6.5%±1%, with the series resistance being 4 $\Omega$cm$^2$, indicating excellent characteristics.

The durability characteristics of these samples was evaluated in the same way as in Example 1. After completion of the temperature and humidity cycle test, the solar cell characteristics were 98% of the initial value, with no degradation. The measurement of the shunt resistance indicated almost no change.

From the results of this example, it was found that the solar cells fabricated with the method of the invention had good yield, excellent characteristics, and high durability.

EXAMPLE 3-2

A solar cell module was fabricated in the same way as in Example 3-1, except that the electrodeposition was performed using a styrene-type anionic electrodeposition paint.

The initial characteristics of the obtained solar cell module were conversion efficiency of 6.4%±1% and shunt resistance of 4 $\Omega$cm$^2$, indicating excellent characteristics. After the temperature and humidity cycle test, the measurement of the solar cell characteristics indicated 98% of the initial value, with no degradation. Also, the measurement of the shunt resistance indicated almost no change.

From the results of this example, it was found that the solar cells fabricated with the method of the invention had good yield, excellent characteristics, and high durability.

EXAMPLE 4-1

A solar cell having a constitution as shown in FIG. 1 was fabricated. First, as in Example 1, on a SUS430BA substrate 101 (30 cm×30 cm, 0.2 mm thick) there was formed a lower electrode 102. Thereafter, the substrate 101 was placed within an RF plasma CVD film forming apparatus (not shown) for the deposition of n-type layer 103, i-type layer 104, and p-type layer 105 in this sequence. As in Example 1, a 70 nm thick transparent upper electrode 106 having an antireflection effect was deposited.

Next, the forming and short circuit passivation treatments were conducted in the same way as in Example 1. Thereafter, insulation treatment was conducted in the electrolytic tank of FIG. 5 using a fluorine-type cationic electrodeposition paint. The substrate was then washed with pure water and cured by heating within an oven at 160° C. for forty minutes. Thereafter, the substrate 101 was taken out of the oven, and after cooling, a bus bar 108 of copper foil with adhesive was laminated thereon to fabricate a solar cell of 30 cm square. With the same method, ten sheets of sample were fabricated.

Further, the encapsulation of these samples was conducted in the same way as in Example 1. The initial characteristic of the samples obtained was conversion efficiency of 7.1%±1%, with the series resistance being 4 $\Omega$cm$^2$, indicating excellent characteristics.

The reliability test of these samples was performed in the same way as in Example 1. After the completion of the temperature and humidity cycle test, the solar cell characteristics were 96% of the initial values, with no degradation. The measurement of the shunt resistance indicated almost no change.

From the results of this example, it was found that the solar cells fabricated with the method of the invention had good yield, excellent characteristics, and high durability.

EXAMPLE 4-2

A solar cell module was fabricated in the same way as in Example 4-1, except that the electrodeposition was performed using a styrene-type anionic electrodeposition paint.

The initial characteristics of the obtained solar cell module were conversion efficiency of 7.1%±1% and shunt resistance of 4 $\Omega cm^2$, indicating excellent characteristics. After the temperature and humidity cycle test, the measurement of the solar cell characteristics indicated 98% of the initial values, with no degradation indicated. Also, the measurement of the shunt resistance indicated almost no change.

From the results of this example, it was found that the solar cells fabricated with the method of the invention had good yield, excellent characteristics, and high durability.

EXAMPLE 5-1

A solar cell having a layer constitution as shown in FIGS. 1A and 1B was fabricated in the following way. First, a SUS430BA substrate 101 (30 cm×30 cm, 0.2 mm thick), which had been subjected to degreasing and washing, was placed within a DC sputtering apparatus (not shown) in which a lower electrode 102 was formed by depositing Cr 200 nm thick. The substrate 101 was taken out and placed within an RF plasma CVD film forming apparatus (not shown) for the deposition of n-type semiconductor region 103, i-type semiconductor region 104, and p-type semiconductor region 105 in this sequence.

Next, the solar cell was treated in the forming treatment apparatus of FIG. 6. The applied voltage was 2.5V reverse biased direct current, with the treatment rate being 200 cm/min.

Next, the back face side of the substrate 504 of the solar cell after the aforementioned treatment was covered with an insulating film made of plastic, and immersed in the electrolytic tank of FIG. 5. The counter electrode 503 used was a 30 cm×30 cm SUS304 stainless plate. The electrodeposition paint 502 used was an acrylic-type cationic electrodeposition paint containing 20% solid components. A -10V voltage was applied to the substrate 504, and held for ten seconds to conduct electrodeposition. The solar cell was removed from the electrolytic bath, washed with pure water to remove unreacted electrodeposition paint, placed in an oven at 50° C., and left for thirteen minutes to dry out the water content. Thereafter, the temperature of the oven was elevated at a rate of 10° C./min, and held for thirty minutes after reaching 180° C., to cure the electrodeposited resin.

Thereafter, the solar cell was taken out of the oven, and after cooling, a part of the solar cell was cut out. Observation of the surface of the semiconductor layer by a scanning-type electron microscope showed that semi-spherical deposits, about 5 µm to 30 µm in diameter, were spotted on the surface of the semiconductor layer 505. Infrared absorption spectrum analysis using an FTIR with a microscopic feature on that portion confirmed that there was absorption peculiar to acrylic resin, and that electrodeposition paint was deposited. Further, observation of the OBIC image for this sample confirmed that only the deposited portions of the electrodeposition paint generated no power, thus indicating that the film was deposited only on the shunt portions.

Next, the solar cell was placed in a vapor deposition apparatus with resistance heating (not shown) in which an alloy of In and Sn was vapor deposited, to deposit a 70 nm thick transparent upper electrode 107, having an antireflection effect.

Next, the solar cell with ITO thereon was placed in a screen printing machine, in which grid electrodes 107, 100 µm wide and 8 cm long, were printed at an interval of 1 cm. The conductive paste contained 70 parts of Ag filler, 30 parts of polyester binder (volume ratio), and 20 parts of ethyl acetate as a solvent. After printing, the solar cell was placed in the oven, and held at 150° C. for thirty minutes to cure the conductive paste.

Further, a bus bar 108 of copper foil with an adhesive 5 mm wide was bonded as shown in FIG. 1B to fabricate a single cell of 30 cm square. With the same method, ten sheets of sample were fabricated.

Next, encapsulation of these samples was conducted in the following way. EVA was laminated both on the front and back surfaces, and a fluororesin film ETFE (ethylene tetrafluoroethylene, tradename Tefzel, manufactured by DuPont) was further laminated on the outer surfaces thereof. Subsequently, the samples were placed in a vacuum laminator and held at 150° C. for sixty minutes for the vacuum lamination, so that a solar cell module was fabricated.

The initial characteristics of the solar cell module thus obtained were measured. The shunt resistance was 500 K$\Omega cm^2$ to 300 K$\Omega cm^2$, indicating excellent characteristics, with less dispersion. Also, the solar cell efficiency was 6.2%±0.5%, indicating excellent characteristics and with less dispersion. The reliability test of the solar cell module was conducted in the same way as in Example 1. After completion of the test, the solar cell efficiency was on average 95% of the initial conversion efficiency, with no significant degradation. Also, the shunt resistance decreased 10%, with no significant degradation. From these results, it was concluded that the series of processings of the present invention had excellent effects.

From the results of this example, it was found that the solar cells fabricated with the method of the invention had good yield, excellent characteristics, and high reliability.

EXAMPLE 5-2

A solar cell module was fabricated in the same way as in Example 5-1, except that the electrodeposited resin was an acrylic-type anionic electrodeposited resin containing 25% solid components, and a voltage of +10V was applied to the substrate.

The initial characteristics of the obtained sample were measured. The shunt resistance was 500 K$\Omega cm^2$ to 300 K$\Omega cm^2$, indicating excellent characteristics, with less dispersion. Also, the solar cell conversion efficiency was 6.5%±0.5% indicating excellent characteristics, with less dispersion.

The reliability test of these samples was conducted in the same way as in Example 1. The solar cell conversion efficiency after completion of the test was on average 95% of the initial conversion efficiency, with no significant degradation. Also, the shunt resistance decreased about 10%, with no significant degradation. From these results, it was found that the series of processings of the present invention had excellent effects.

From the results of this example, it was concluded that the solar cells fabricated with the method of the invention had good yield, excellent characteristics, and high reliability.

EXAMPLE 6-1

A solar cell with the constitution of FIG. 2 was fabricated in substantially the same way as in Example 5.

First, a transparent upper electrode 206 of $SnO_2$ was deposited on a Corning 7059 substrate 201 of 30 cm square, using a vapor deposition apparatus, not shown. Thereafter, upper electrode 206 was patterned by etching so that spaced apart subcells 2 cm wide were arranged with a gap of 5 mm. Next, using a metal mask, p-type semiconductor region 205, i-type semiconductor region 204, and n-type semiconductor region 203 were deposited to substantially cover the upper electrode 206.

Next, in the same way as in Example 5, the forming treatment was conducted. Subsequently, the substrate 201 thus treated was immersed in an electrolytic tank 501 for electrodeposition using an epoxy-type cationic electrodeposition paint. After washing, drying, and curing, the substrate was placed in a sputtering apparatus (not shown) to form a lower electrode of aluminum, using a metal mask, so that ten series of single cells of 30 cm square were fabricated. Further, encapsulation of these samples was conducted in the same way as in Example 1. With the above fabrication method, ten sheets of solar cell modules were fabricated.

The initial characteristics of the obtained solar cell module were such that the conversion efficiency was 6.0%±1%, and the shunt resistance was from 350 to 200 $K\Omega cm^2$.

Next, the reliability test for this sample was evaluated in the same way as in Example 1. After the temperature and humidity cycle test, measurement of the solar cell characteristics indicated 97% of the initial value, with no degradation indicated. Also, measurement of the shunt resistance indicated almost no change.

From the results of this example, it was found that the solar cells fabricated with the method of the invention had good yield, excellent characteristics, and high durability.

EXAMPLE 6-2

A solar cell module was fabricated in the same way as in Example 6-1, except that the electrodeposition was performed using an epoxy-type anionic electrodeposition paint.

The initial characteristics of the obtained solar cell module were conversion efficiency of 6.3%±1% and shunt resistance of from 350 to 200 $K\Omega cm^2$.

After the temperature and humidity cycle test, measurement of the solar cell characteristics indicated 95% of the initial value, with no degradation indicated. Also, the measurement of the shunt resistance indicated almost no change.

From the results of this example, it was found that the solar cells fabricated with the method of the invention had good yield, excellent characteristics, and high durability.

EXAMPLE 7-1

A solar cell having a constitution as shown in FIGS. 1A and 1B was fabricated in substantially the same way as in Example 5.

As in Example 1, on a SUS430BA substrate 101 (30 cm×30 cm, 0.2 mm thick) there was formed a lower electrode 102. The substrate 101 was then placed within an RF plasma CVD film forming apparatus (not shown) for the deposition of n-type semiconductor region 103, i-type semiconductor region 104, and p-type semiconductor region 105 in this sequence.

Next, after the forming treatment was conducted in the same way as in Example 5, the back face side of the substrate 101 was covered with an insulating film made of plastic in the same way as in Example 5, and immersed in the electrolytic tank of FIG. 5. Insulation treatment was made using a styrene-type cationic electrodeposition paint.

The substrate was then washed with pure water and the electrodeposited resin cured within an oven. Thereafter, the substrate 101 was taken out of the oven, and after cooling, ITO as a 70 nm thick transparent upper electrode having an antireflection effect was deposited. Further, a bus bar 108 of copper foil with adhesive was laminated thereon to fabricate a single cell of 30 cm square. With the same method, ten sheets of sample were fabricated.

Further, the encapsulation of this sample was conducted in the same way as in Example 1.

The initial characteristic of the sample obtained was 6.1%±1%, with the series resistance being 4 $\Omega cm^2$, indicating excellent characteristics.

The durability characteristics of this solar cell module were evaluated in the same way as in Example 1. After completion of the temperature and humidity cycle test, the measurement of the solar cell characteristic for this sample indicated 99% of the initial values, with no degradation. The measurement of the shunt resistance indicated almost no change.

From the results of this example, it was found that the solar cell fabricated with the method of the present invention had good yield, excellent characteristics, and high durability.

EXAMPLE 7-2

A solar cell module was fabricated in the same way as in Example 7-1, except that the electrodeposition was performed using a styrene-type anionic electrodeposition paint.

The initial characteristic of the obtained solar cell module was 6.1%±1% and the series resistance was 4 $\Omega cm^2$, indicating excellent characteristics.

The durability characteristic of this sample was evaluated in the same way as in Example 1. After the temperature and humidity cycle test, the measurement of the solar cell characteristics of this sample indicated 99% of the initial values, with no degradation indicated. Also, the measurement of the shunt resistance indicated almost no change.

From the results of this example, it was concluded that the solar cells fabricated with the method of the present invention had good yield, excellent characteristics, and high durability.

EXAMPLE 8-1

As in Example 5, on a SUS430BA substrate 101 (30 cm×30 cm, 0.2 mm thick) there was formed a lower electrode 102. The substrate 101 was placed within an RF plasma CVD film forming apparatus (not shown) for the deposition of n-type semiconductor region 103, i-type semiconductor region 104, and p-type semiconductor region 105 in this sequence.

The forming treatment was conducted in the same way as in Example 5. The insulation treatment was made in the electrolytic tank of FIG. 5, using a fluorine-type cationic electrodeposition paint. The substrate was then washed with pure water and cured by heating at 160° C. in an oven for forty minutes. Thereafter, the substrate 101 was taken out of the oven, and after cooling, ITO as a 70 nm thick transparent conductive layer having an antireflection feature was deposited thereon. Further, a bus bar 108 of copper foil with adhesive was laminated thereon to fabricate a single cell of 30 cm square. In the same way, ten sheets of sample were fabricated.

Further, encapsulation of this sample was conducted in the same way as in Example 1.

The initial characteristics of the solar cell module obtained were such that the conversion efficiency was 6.8%±1%, with the series resistance being 4 $\Omega cm^2$, indicating excellent characteristics.

After completion of the temperature and humidity cycle test, the solar cell characteristic of the sample was 97% of the initial values, with no degradation. The measurement of the shunt resistance indicated almost no change.

From the results of this example, it was found that the solar cell fabricated with the method of the present invention had good yield, excellent characteristics, and high durability.

EXAMPLE 8-2

A solar cell module was fabricated in the same way as in Example 8-1, except that the electrodeposition was performed using a fluorine-type anionic electrodeposition paint.

The initial characteristics of the obtained solar cell module were such that the conversion efficiency was 6.5%±1%, and the series resistance was 4 $\Omega cm^2$, indicating excellent characteristics.

After the temperature and humidity cycle test, the measurement of the solar cell characteristic of the sample indicated 96% of the initial values, with no degradation indicated. Also, the measurement of the shunt resistance indicated almost no change.

From the results of this example, it could be found that the solar cells fabricated with the method of the present invention had good yield, excellent characteristics, and high durability.

As above described, according to the present invention, as a result of the defective portions being selectively insulated with an electrodeposited resin, it is possible to provide a solar cell having high shunt resistance, high photoelectric conversion efficiency, and high reliability. Also, it is possible to provide a fabrication method of solar cells with high yield, performance, and reliability.

What is claimed is:

1. A method of fabricating a photovoltaic semiconductor element subject to formation of defective portions consisting of the steps of:
   (a) forming a photovoltaic laminate structure comprising a semiconductor layer and an overlying conductive layer on a conductive substrate, and performing a forming treatment thereon, in which an elongated conductive member moves on a surface of said semiconductor layer while making contact with said surface of said semiconductor layer and applies a voltage to said semiconductor layer to convert defective portions therein to low resistance regions;
   (b) performing passivation treatment of said low resistance regions by immersing said photovoltaic laminate in an electrolyte, thereby providing electrolytic conduction between an electrode located in said electrolyte and said photovoltaic laminate whereby recesses form in said semiconductor layer and said overlying conductive layer at a position corresponding to said low resistance regions; and
   (c) selectively covering said recesses with an insulator material to form said photovoltaic semiconductor element.

2. The method according to claim 1, wherein said conductive substrate is a belt-like substrate.

3. The method according to claim 1, wherein said semiconductor layer is a non-single crystalline semiconductor.

4. The method according to claim 3, wherein the non-single crystalline semiconductor is formed from an amorphous silicon or polysilicon.

5. The method according to claim 1, wherein said photovoltaic semiconductor element has a shunt resistance, after said forming treatment, in the range from $1 \times 10^3$ $\Omega cm^2$ to $1 \times 10^6$ $\Omega cm^2$.

6. The method according to claim 1, wherein said insulator material is transparent.

7. The method according to claim 1, wherein said step (c) consists of immersing said photovoltaic laminate into a liquid containing an electrode and a cationic or anionic resin to provide electrolytic conduction between the electrode located in said liquid and the defective portions of said semiconductor layer to selectively adhere the cationic or anionic resin to said recesses to seal said recesses with the insulator material.

8. The method according to claim 1, wherein said photovoltaic laminate includes a semiconductor layer having a pin junction.

9. The method according to claim 1, wherein said photovoltaic laminate includes a semiconductor layer having a pn junction.

10. The method according to claim 8 or 9, wherein said voltage is reverse-bias voltage or voltage alternating between forward-bias and reverse-bias with respect to said semiconductor layer.

11. The method according to claim 1, wherein said photovoltaic laminate includes a laminated semiconductor layer having at least two semiconductor junctions.

12. The method according to claim 1, wherein said photovoltaic laminate includes a transparent conductive layer.

13. An apparatus for fabricating a photovoltaic semiconductor element subject to formation of defective portions consisting of:
   (a) means for forming a photovoltaic laminate comprising a semiconductor layer and an overlying conductive layer on a conductive substrate;
   (b) means for performing a forming treatment of said laminate using an elongated conductive member which moves on a surface of said semiconductor layer while making a contact with said surface of said semiconductor layer and applies a voltage to said semiconductor layer to convert defective portions therein to low resistance regions;
   (c) means for immersing said photovoltaic laminate in an electrolyte to establish electrolytic conduction between an electrode located in said electrolyte and said photovoltaic laminate to form recesses in said semiconductor layer and said overlying conductor layer at positions corresponding to said low resistance regions, thereby providing a passivation treatment; and
   (d) means for selectively covering said recesses with an insulator material.

14. A method of fabricating a photovoltaic semiconductor element subject to formation of defective portions consisting of the steps of:
   (a) forming a photovoltaic semiconductor layer on a conductive substrate and performing a forming treatment thereon, in which an elongated conductive member moves on a surface of said semiconductor layer while making a contact with said surface of said semiconductor layer and applies a voltage to said semiconductor layer to convert defective portions therein to low resistance regions;
   selectively covering said low resistance regions with an insulator material; and
   forming a conductive layer on the semiconductor layer having the low resistance regions selectively covered with said insulator.

15. The method according to claim 14, wherein the conductive member is a conductive brush or a conductive rubber roller.

16. The method according to claim 14, wherein the semiconductor layer is a non-single crystalline semiconductor.

17. The method according to claim 16, wherein the non-single crystalline semiconductor is formed from amorphous silicon or polysilicon.

18. The method according to claim 14, wherein the photovoltaic element includes a semiconductor layer having a pin junction.

19. The method according to claim 14, wherein the photovoltaic element includes a semiconductor layer having a pn junction.

20. The method according to claim 18 or 19, wherein said voltage is reverse-bias voltage or voltage alternating between forward-bias and reverse-bias with respect to said semiconductor layer.

21. The method according to claim 14, wherein the photovoltaic element includes a laminated semiconductor layer having at least two semiconductor junctions.

22. The method according to claim 14, wherein the photovoltaic element includes a transparent conductive layer.

23. The method according to claim 1 or 14, wherein said elongated conductive member is a conductive brush or a conductive roller.

24. An apparatus for fabricating a photovoltaic semiconductor element subject to formation of defective portions consisting of:
   (a) means for forming a photovoltaic laminate comprising a semiconductor layer on a conductive substrate;
   (b) means for performing a forming treatment of said laminate using an elongated conductive member which moves on a surface of said semiconductor layer while making a contact with said surface of said semiconductor layer and applies a voltage to said semiconductor layer to convert defective portions therein to low resistance regions
   (c) means for selectively covering the low resistance regions with an insulator material; and
   (d) means for providing a conductive layer on the semiconductor layer having the low resistance regions selectively covered with said insulator material.

25. The apparatus according to claim 13 or 24, wherein said elongated conductive member is a conductive brush or a conductive roller.

26. A method of fabricating a photovoltaic semiconductor element subject to formation of defective portions consisting of the steps of:
   (a) forming a photovoltaic laminate structure comprising a semiconductor layer and an overlying conductive layer on a conductive substrate and performing a forming treatment thereon, in which an elongated conductive member moves on a surface of said semiconductor layer while making a contact with said surface of said semiconductor layer and applies a voltage to said semiconductor layer to convert defective portions therein to low resistance regions;
   (b) performing passivation treatment of said low resistance regions by immersing said photovoltaic laminate in an electrolyte to provide electrolytic conduction between an electrode located in said electrolyte and said photovoltaic laminate whereby recesses form at positions corresponding to said low resistance regions;
   (c) sealing said recesses with an insulator material to form said photovoltaic semiconductor element; and
   (d) forming a conductive layer on the semiconductor layer having low resistance regions selectively sealed with said insulator material.

27. The method according to claim 26, wherein said step (c) consists of immersing said photovoltaic laminate into a liquid containing an electrode and a cationic or anionic resin to provide electrolytic conduction between the electrode located in said liquid and the defective portion of said photovoltaic laminate to selectively adhere the cationic or anionic resin to said recesses to cover said recesses with the insulator material.

28. The method according to claim 26, wherein the photovoltaic laminate includes a semiconductor layer having a pin junction.

29. The method according to claim 26, wherein the photovoltaic element includes a semiconductor layer having a pn junction.

30. The method according to claim 26, wherein the photovoltaic laminate includes a laminated semiconductor layer having at least two semiconductor junctions.

31. The method according to claim 26, wherein the photovoltaic laminate includes a transparent conductive layer.

32. A method of fabricating a photovoltaic semiconductor element subject to formation of defective portions consisting of the steps of:
   (a) forming a photovoltaic laminate structure comprising a semiconductor layer and an overlying conductive layer on a conductive substrate, and performing a forming treatment thereon, in which an elongated conductive member moves on a surface of said semiconductor layer while making contact with said surface of said semiconductor layer and applies a voltage to said semiconductor layer to convert defective portions therein to low resistance regions; and
   (b) performing passivation treatment of said low resistance regions by immersing said photovoltaic laminate in an electrolyte, comprising the step of providing electrolytic conduction between an electrode located in said electrolyte and said photovoltaic laminate whereby recesses form in said semiconductor layer and said overlying conductive layer at a position corresponding to said low resistance regions.

33. An apparatus for fabricating a photovoltaic semiconductor element subject to formation of defective portions consisting of:
   (a) means for forming a photovoltaic laminate comprising a semiconductor layer and an overlying conductive layer on a conductive substrate;
   (b) means for performing a forming treatment of said laminate using an elongated conductive member which moves on a surface of said semiconductor layer while making a contact with said surface of said semiconductor layer and applies a voltage to said semiconductor layer to convert defective portions therein to low resistance regions;
   (c) means for immersing said photovoltaic laminate in an electrolyte to establish electrolytic conduction between an electrode located in said electrolyte and said photovoltaic laminate to form recesses in said semiconductor layer and said overlying conductor layer at positions corresponding to said low resistance regions, thereby providing a passivation treatment.

* * * * *

UNITED STATES PATENT AND TRADEMARK OFFICE
CERTIFICATE OF CORRECTION

PATENT NO. : 6,132,585

DATED : October 17, 2000

INVENTOR(S) : TAKAFUMI MIDORIKAWA ET AL.    Page 1 of 2

It is certified that error appears in the above-identified patent and that said Letters Patent is hereby corrected as shown below:

ON THE COVER PAGE [56] REFERENCES CITED

After "Improvement", "and" should read --of-- and "pp. 648-169." should read --pp. 1648-1649.--.

COLUMN 6

Line 17, "be also" should read --also be--.

COLUMN 14

Line 59, "ODIC" should read --OBIC---.

COLUMN 18

Line 40, "film forming" should read --film-forming--.

UNITED STATES PATENT AND TRADEMARK OFFICE
CERTIFICATE OF CORRECTION

PATENT NO. : 6,132,585
DATED : October 17, 2000
INVENTOR(S) : TAKAFUMI MIDORIKAWA ET AL.

It is certified that error appears in the above-identified patent and that said Letters Patent is hereby corrected as shown below:

COLUMN 19

Line 55, "semi-spherical" should read --semispherical--.

COLUMN 24

Line 62, "selectively" should read --(b) selectively--; and
Line 65, "forming" should read --(c) forming--.

COLUMN 25

Line 40, "regions" should read --regions;--.

COLUMN 26

Line 57, "regions;" should read --regions; and--.

Signed and Sealed this

First Day of May, 2001

Attest:

NICHOLAS P. GODICI

*Attesting Officer*    *Acting Director of the United States Patent and Trademark Office*